United States Patent [19]

Garner

[11] Patent Number: 4,581,680

[45] Date of Patent: Apr. 8, 1986

[54] CHIP CARRIER MOUNTING ARRANGEMENT

[75] Inventor: Robin E. Garner, Rolling Meadows, Ill.

[73] Assignee: GTE Communication Systems Corporation, Northlake, Ill.

[21] Appl. No.: 688,104

[22] Filed: Dec. 31, 1984

[51] Int. Cl.[4] ............................................. H05K 1/18
[52] U.S. Cl. ................................. 361/403; 174/68.5; 361/400; 361/404; 361/408
[58] Field of Search ............... 174/68.5; 361/400, 403, 361/405, 406, 408

[56] References Cited

U.S. PATENT DOCUMENTS

| 3,149,266 | 9/1964 | Lipton | 361/406 |
| 3,373,481 | 3/1968 | Lins et al. | 361/406 X |
| 3,486,223 | 12/1969 | Butera | 361/406 X |
| 3,777,270 | 12/1973 | Tatsuko et al. | 361/400 X |
| 4,238,527 | 12/1980 | Monnier et al. | 361/400 X |
| 4,417,296 | 11/1983 | Schelhorn | 361/406 X |
| 4,437,141 | 3/1984 | Prokop | 361/403 |

OTHER PUBLICATIONS

E. Stephens, Pinless Module Connector, IBM Tech. Disc. Bull., V. 20 #10, Mar. 1978, p. 3872.

*Primary Examiner*—R. R. Kucia
*Attorney, Agent, or Firm*—Charles A. Doktycz

[57] ABSTRACT

A leadless ceramic chip carrier for surface mounting on an epoxy printed circuit board is shown featuring an arrangement for relieving the thermally induced stress by progressively lengthening the attaching solder pillars as the distance from the center line of the ceramic chip increases to avoid exceeding the elastic limits of the solder.

5 Claims, 2 Drawing Figures

CHIP CARRIER MOUNTING ARRANGEMENT

FIELD OF THE INVENTION

This invention relates generally to an assembly and method of mounting a ceramic chip carrier integrated circuit on a circuit wiring board and more particularly to an arrangement of the circuit terminations on the chip carrier.

BACKGROUND OF THE INVENTION

Surface mounted devices such as chip carriers are becoming increasingly used in the manufacture of electronic assemblies. One type of chip carrier that is presently used is the leadless chip carrier. The leadless package, typically is in the form of a thin rectangular substrate, frequently a ceramic, having a plurality of conductive areas or pads spaced along its edges, or bottom surface. Advantages of the leadless carriers include lower cost, lower lead inductance, fewer joints and greater ruggedness during handling and manipulation in the manufacturing cycle. These carriers are then mounted within a cavity or frame so that the conductive pads on the carrier make a pressure contact within the frame. Another arrangement involves the soldering of the chip carrier directly to the printed wiring circuit board. This latter method offers the advantage of less parts handling and generally a more compact overall structure. But it is not without its disadvantages, and the primary disadvantage is that thermal changes in the circuit boards environment cause the solder bonds to open circuit. This fault is the result of the unequal expansion between the carrier and the circuit board producing great strains at the solder joints resulting cracks and other related failures.

SUMMARY OF THE INVENTION

Accordingly it is an object of the present invention to provide a soldering arrangement for the mounting of ceramic chip carriers onto printed circuit cards that will result in a decreased stress and resultant failure therefrom of the solder joints.

This is accomplished by increasing the thickness of each solder joint as the distance from the device center increases. Thus, the acceptable stress profile of the solder joint located on the centerline is maintained in the solder joints across the width due to the increased thickness of the solder.

BRIEF DESCRIPTION OF THE DRAWINGS

Other objects, advantages and features of the invention will be more readily understood from the following description, when read in conjunction with the accompanying drawings in which.

DESCRIPTION OF THE PREFERRED EMBODIMENT

Figure 1:
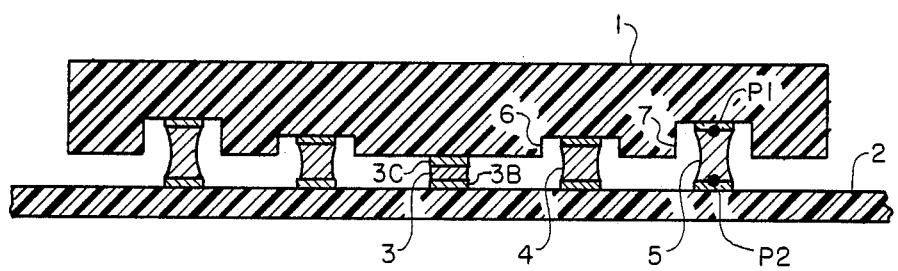
FIG. 1 is a sectional view of a ceramic chip carrier through the solder joints progressing out from the center line.

FIG. 1 shows in a sectional view a surface mounted ceramic chip carrier 1 on a printed circuit board 2. The chip 1 is attached by a series of solder pillars 3, 4 and 5, joining corresponding pads of the circuit terminations of the chip 1 and the printed circuit card 2, as shown at 3C for the ceramic chip and at 3B for the corresponding pad of the circuit board. The solder joint 3 at the center of the chip is shown as being shorter in height than the solder joints 4 and 5 located progressivly farther from the center. This increased length of the solder pillar is facilitated in the embodiment illustrated by increasing the depth of the recesses 6 and 7 for the contact pads of the chip as the distance from the center of the chip is increased. However, this same effect could be obtained if the ceramic chip were made with stepped decreases in thickness progressing outward.

Figure 2:
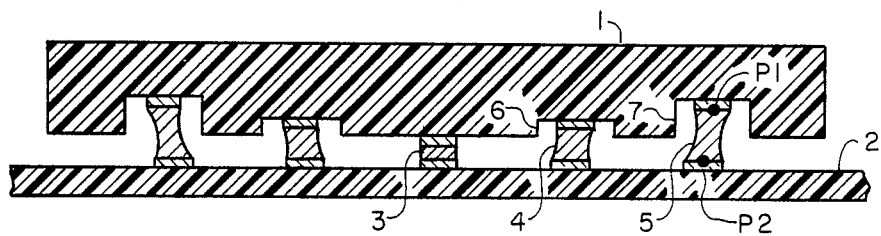
FIG. 2 is a view similar to FIG. 1 but showing the effects of decreased temperature.

FIG. 2 is similar to FIG. 1 except that it is drawn to illustrate the action of the assembly upon cooling below an operating temperature. The glass epoxy of the printed circuit board has a much greater coefficient of thermal expansion than does the ceramic chip and, as can be seen in the illustration, results in a distorting of the solder pillars. Were the pillars all of the same height as at pillar 3, they would be stiffer and transfer the induced strain to the circuit pads of both the ceramic chip and the circuit board. This strain would eventually result in the cracking of the joints and occasionally in the printed circuit of the circuit board when it was deformed and occasionally even in a cracking of the ceramic chip. However, by progressively increasing the height of the solder pillar as the distance from the center of the chip increases, the elastic limits of the solder are not exceeded, resulting in the prevention of the temperature induced faults.

In FIG. 1 the center of the solder pillar 5 at the surface of the ceramic chip within the recess is shown as the dot P1, the corresponding center on the circuit board is shown as P2. In FIG. 2 these same two centers are shown with the relative displacement as induced by the cooling of the assembly. The solder pillar 5 is distorted but, because of its greater length, the distortion is within its ability to flex and thus reduce the strain on the circuit terminating pads.

It will be obvious to those skilled in the art that numerous modifications of the present invention can be made without departing from the spirit of the invention which shall be limited only by the scope of the claims appended hereto.

What is claimed is:

1. A printed circuit board and leadless circuit chip carrier assembly comprising;
    a leadless integrated circuit ceramic chip,
    a plurality of conductors associated with said integrated circuit,
    said plurality of conductors extending to one face of said chip,
    a plurality of corresponding contact pads terminating said plurality of conductors on said one face,
    a printed circuit board including a corresponding plurality of circuit terminating contact pads,
    solder means connecting said corresponding circuit terminating pads of said circuit board and said ceramic chip,
    said contact pads on said one face on said ceramic chip characterized in that said pads are located in recesses in said chip face at a greater distance from said circuit board surface as the distance of their location from the center of the chip increases.

2. A printed circuit board and chip carrier assembly as claimed in claim 1, wherein said greater distance from said circuit board surface is obtained by locating said circuit pads in recesses in said chip face.

3. A printed circuit board and chip carrier assembly as claimed in claim 1, wherein said chip carrier is a ceramic chip.

4. A printed circuit board and chip carrier assembly as claimed in claim 1, wherein said chip carrier is a plastic chip.

5. A printed circuit board and chip carrier assembly as claimed in claim 1, wherein said printed circuit board is an epoxy type board.

* * * * *